Feb. 21, 1967 P. R. THOMAS ETAL 3,305,709

T-SHAPE FIELD-EFFECT SWITCH HAVING A CONTINUOUS HIGH OUTPUT IMPEDANCE

Filed July 24, 1964 3 Sheets-Sheet 1

INVENTORS
P. R. THOMAS
M. W. LARKIN
BY
John D. Graham

Feb. 21, 1967 P. R. THOMAS ETAL 3,305,709

T-SHAPE FIELD-EFFECT SWITCH HAVING
A CONTINUOUS HIGH OUTPUT IMPEDANCE

Filed July 24, 1964 3 Sheets-Sheet 2

INVENTORS
P. R. THOMAS
M. W. LARKIN

BY John D. Graham

INVENTORS
P. R. THOMAS
M. W. LARKIN
BY
John D. Graham

United States Patent Office 3,305,709

Patented Feb. 21, 1967

3,305,709

T-SHAPE FIELD-EFFECT SWITCH HAVING A CONTINUOUS HIGH OUTPUT IMPEDANCE

Philip R. Thomas, 8208 Spring Valley Road, Dallas, Tex. 75220, and Melvin W. Larkin, 4907 Point Circle Drive, Monroeville, Pa. 15146

Filed July 24, 1964, Ser. No. 384,943

Claims priority, application Great Britain, July 26, 1963, 29,818/63

4 Claims. (Cl. 317—235)

Figure 1:
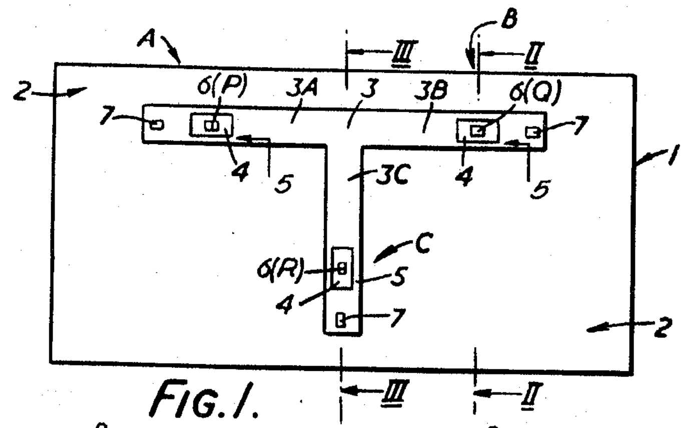

This invention relates to field-effect semiconductor structures and to methods of manufacturing such structures.

According to the present invention, a field-effect semiconductor structure comprises a monolithic block of semiconductor material having a first region of one conductivity type, a T-shaped second region of opposite conductivity type formed in the first region and third regions of the one conductivity type within the respective arms and leg of the T-shaped region, each third region together with the first region forming a field-effect semiconductor device.

The devices are formed by making ohmic connections to the second region in the vicinity of each third region, and by making ohmic connections to each third region and to the first region. The ohmic connections to the third regions provide gate terminals for the respective devices whilst that to the first region provides a gate terminal common to all three devices. The ohmic connection to the first region may be provided by a contact terminal formed on the region or by a conductive mounting for the block.

In an alternative form of construction, the block may be divided into two electrically separated first regions, for example by a region of opposite-type conductivity extending through the block, the arms of the T-shaped region disposed in one of the first regions and the leg extending into the other of the first regions. The ohmic connections to the second and third regions are made as previously described and in addition ohmic connections are made to the first regions adjacent the respective third regions.

The first region may be formed by a suitable doping of the substrate material and, conveniently the second and third regions may be formed by diffusion techniques.

The third regions preferably are formed near the ends of the arms and leg of the T-shaped second region with the ohmic connections to the T-shaped second region located between the third regions and the respective ends of the arms and leg of the T-shaped region, as the case may be.

One form of structure embodying the invention utilizes an n-type silicon block to provide the first region, the second and third regions being formed by p-type and n-type diffusions using oxide-masking techniques.

A structure embodying the invention may be utilized as a switching device, forming the equivalent of a resistive T-network. In such an application, the gate terminals of the third region in the arms of the T-shaped region are connected to a common drive point whilst the gate terminal of the third region in the leg of the T-shaped region is connected to a separate drive point. The gate terminal(s) of the first region may be held at a voltage approximately equal to the gate input voltage or, in the alternative construction having two first regions may be commoned with the respective gate terminals of the third regions. The switch is turned to an ON condition by applying a suitable D.C. potential to the two drive points such that conduction channels formed in the arms of the T-shaped region between the one first region and the third regions in those arms are both biased to a low impedance condition whilst the conduction channel formed in the leg of the T-shaped region between the other first region and the third region is biased to a high impedance condition. The switch is turned to an OFF condition by applying a suitable D.C. potential to the drive points which reverse the ON conditions of the field-effect devices, i.e., the conduction channels in the arms of the T-shaped region are in a high impedance condition whilst that in the leg of the T-shaped region is in a low impedance condition.

Typical impedance values for the field-effect devices are in the region of several hundred ohms for the low impedance condition and several megohms for the high impedance, or pinched off, condition.

Further, in accordance with the invention, a multi-element switching array, incorporating switching structures as defined above, may be formed in a single block of semiconductor material.

A structure according to the invention lends itself to integrated or solid state circuit construction techniques.

Figures 2, 3, 4:
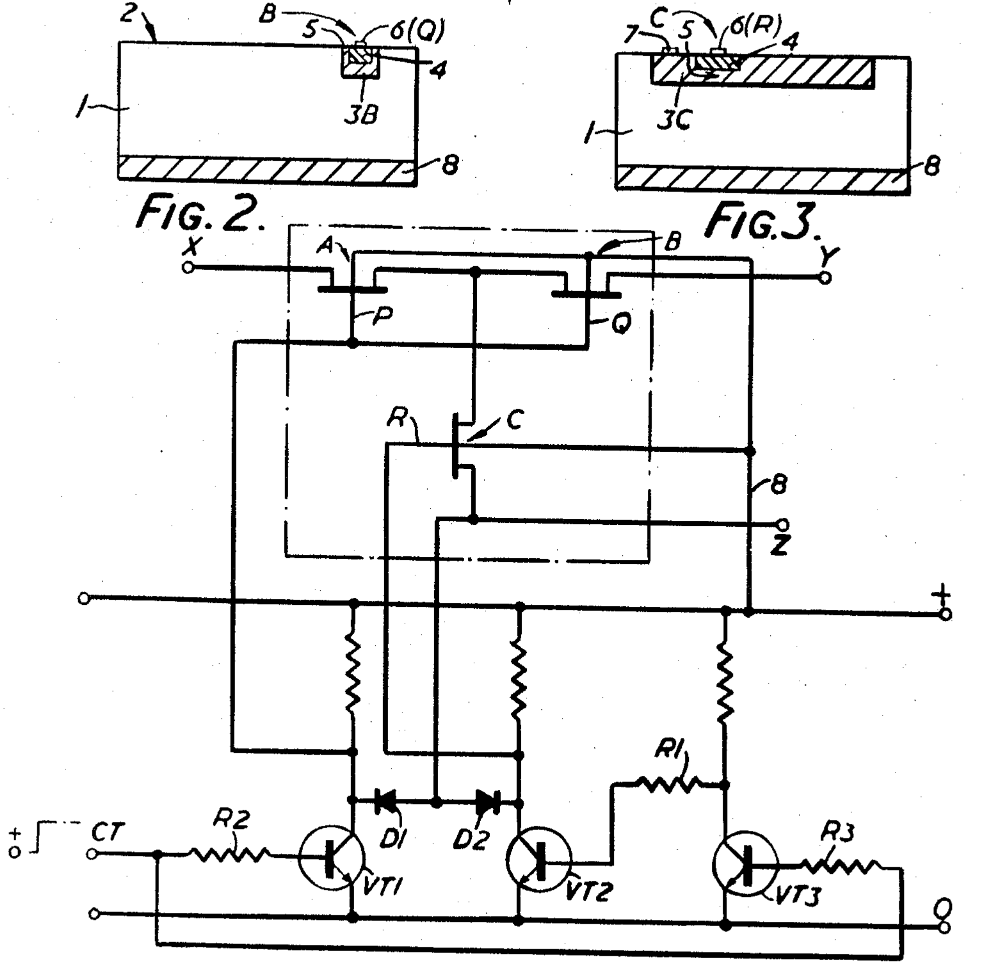
Figure 5:
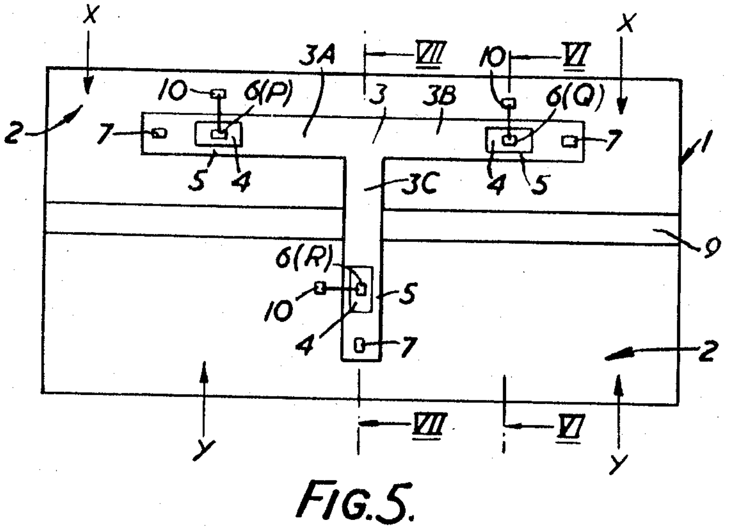
Figure 6:
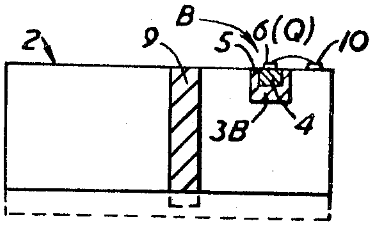
Figure 7:
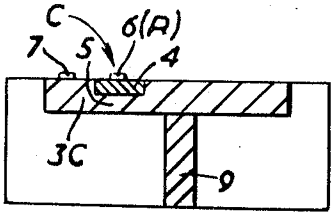
Figure 8:
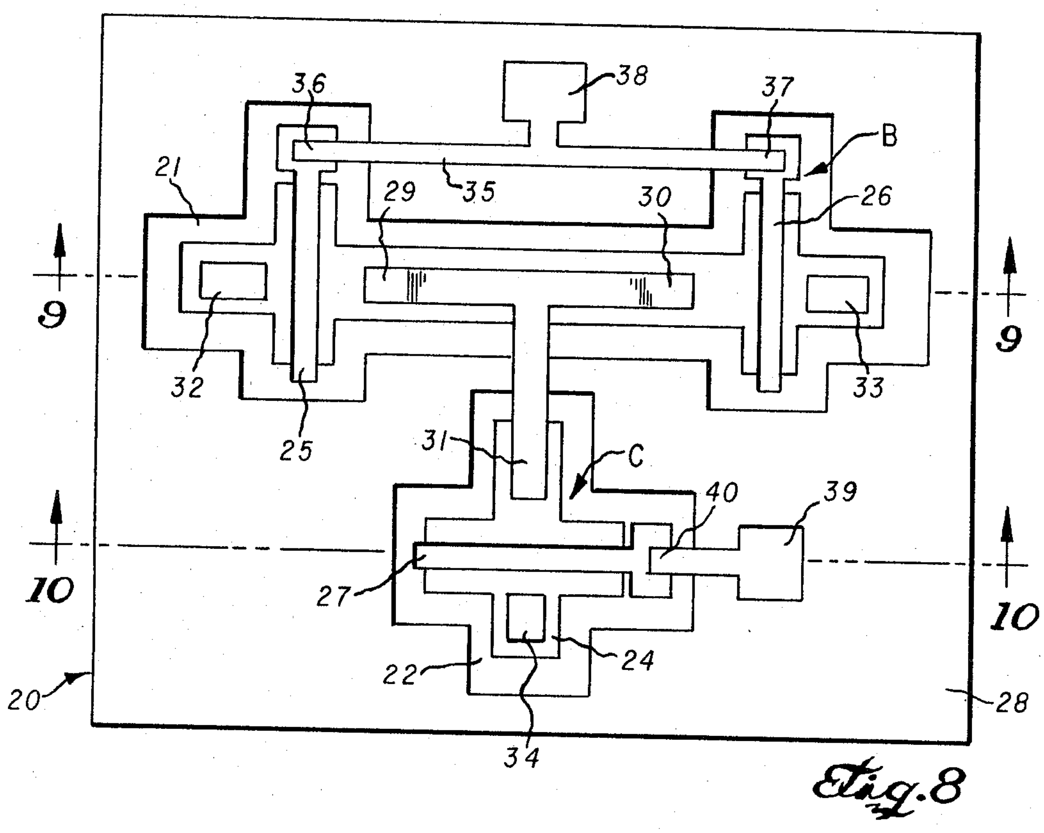
Figure 9:
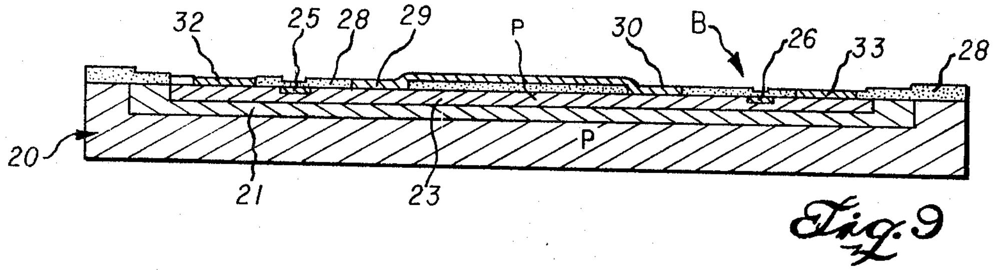
Figure 10:
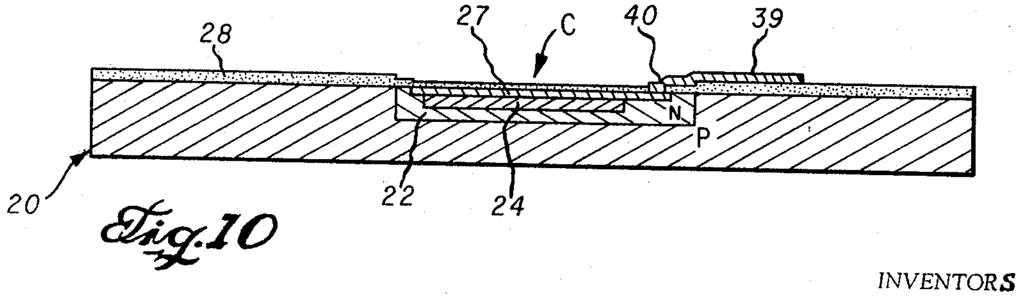

By way of example, an embodiment of the invention and its manner of manufacture, will be described with reference to the accompanying drawings in which:

FIGURE 1 is a top plan view, not to scale, of a structure according to the invention, FIGURE 2 is a section on the line II—II in FIGURE 1 showing also an intermediary step in the manufacturing process, FIGURE 3 is a section on the line III—III in FIGURE 1, FIGURE 4 shows a switching circuit incorporating a structure of the type shown in FIGURES 1–3 according to the invention, FIGURES 5–7 are views similar to FIGURES 1–3 of an embodiment utilizing an alternative form of construction, and FIGURE 8 is a top view of another switch according to this invention, and FIGURES 9 and 10 are sectional views along the lines 9—9 and 10—10 in FIGURE 8, respectively.

Referring to FIGURES 1–3, an n-type rectangular silicon block 1 contains a T-shaped p-type region 3, extending partly into the thickness of the block 1 from the face 2. The T-shaped region has arms 3A and 3B extending lengthwise along the block and a leg 3C extending across the block. The T-shaped region 3 contains three rectangular n-type regions 4 disposed symmetrically in the arms 3A and 3B and leg 3C respectively of the T-shaped region, towards the extremities thereof. The regions 4 extend from the face 2 partly into the thickness of the p-type region 3, and channels 5 are defined between the edges of the regions 4 and of the T-shaped region 3.

Aluminum ohmic contacts 7 are alloyed to the p-type regions 3, being located one between each n-type region 4 and the extremities of the respective portions 3A, 3B and 3C, and ohmic contacts 6 are similarly formed on the respective n-type regions 4. An ohmic contact is made to the block 1, being either formed by a suitable mounting 8 for the block 1, as illustrated, or by an alloyed contact on a face of the block.

There are thus formed interdependently field-effect semiconductor devices A, B and C, located one towards the end of each of the portions 3A, 3B and 3C of the T-shaped region. The devices A, B and C have gate electrodes comprising the respective contacts 6 the contact 8 forming a gate electrode common to all three devices. By application of a bias potential to the gating electrode 6 of a device and the common gating electrode 8 a transverse electric field is applied across the p-type semiconducting current path of that device, formed by the channel 5, and the conductivity of that path can be varied by adjustment of the bias potential to the gating electrode. A device, A, B or C, is in a fully conductive, or low impedance, condition when there is no reverse bias across the p-n junctions formed between the regions 4, 3 and 1 of that device and by sufficiently increasing the reverse bias, the resistivity of the path 5 of a device can be increased until the path is effectively closed and is in a high impedance, or pinched-off, condition.

The complete structure shown in FIGURES 1–3 is a field-effect semiconductor comprising the field-effect devices A, B and C which, together, forms the equivalent of a resistive T-network whose impedance can be varied by variation of a biasing potential applied to the gate electrodes comprising the respective contacts 6 and the common contact 8. Typical impedance values for the devices A, B and C are about 500 ohms when in the low impedance condition and greater than 5M ohms when in the high impedance, or pinched-off, condition.

The structure described with reference to FIGURES 1–3 is manufactured in the following manner.

The n-type silicon block 1 is masked to expose only a T-shaped region on the face 2 and the block is exposed to an atmosphere from which p-type impurity diffuses into the unmasked region to a relatively shallow depth to form the T-shaped region 3, as shown in FIGURES 2 and 3. The block 1 then is again masked to expose on the face 2 only three rectangular regions within, and towards the extremities of the arms 3A, 3B and the leg 3C of the T-shaped region 3 and the block is then exposed to an atmosphere from which an n-type impurity diffuses into the unmasked regions to a depth less than that of the region 3, and forms the regions 4.

The aluminum contacts 6 and 7 are then alloyed in the positions previously described and wire connections to the respective contacts are made by thermo-compression bonding, or other suitable technique. The contact 8 is also formed on the block 1 at this point.

The masking described above conveniently may be effected by known oxide masking techniques.

The resultant semiconductor field-effect structure shown in FIGURES 1–3 may usefully be employed as a switching element and in FIGURE 4 the equivalent electrical circuit of the structure is shown connected to a suitable control circuit.

The control circuit has three common-emitter npn transistor stages VT1, VT2 and VT3. Two diodes, D1 and D2, are connected back-to-back between the collectors of transistors VT1 and VT2 and the collector of transistor VT3 is direct coupled by a resistor R1 to the base of transistor VT2. A control pulse input terminal CT is connected by resistors R2 and R3 respectively to the bases of transistors VT1 and VT3.

The field-effect semiconductor structure comprising the devices A, B and C has terminals X, Y and Z. The gate electrodes P and Q of the devices A and B are both connected to the collector of transistor VT1 whilst the gate electrode R of the device C is connected to the collector of transistor VT2. The common gate electrode 8 is connected to the positive RT supply rail of the control circuit. The terminal Z is connected to the junction of diodes D1 and D2.

The control circuit is operable to apply drive pulses to the gate electrodes P, Q and R such that either the devices A and B are switched to a low impedance condition, and the device C is switched to a high impedance condition (in which condition there is a low impedance path between terminals X and Y and a high impedance path between terminal Z and the junction of the devices A and B and the switch is closed), or such that the devices A and B are switched to a high impedance condition and the device C to a low impedance condition (in which condition there is a high impedance path between terminals X and Y and a low impedance path between terminal Z and the junction of the devices A and B, and the switch is open).

To close the switch, a positive input step is applied to the terminal CT which switches transistors VT1 and VT3 to an ON, or fully conductive, state. The collector of transistor VT1 thus drops to ground potential, no bias is applied to the gate electrodes P and Q, and consequently the semiconducting p-type path between terminals X and Y is taken into a low impedance condition. At the same time, the switching on of transistor VT3 takes its collector to ground and hence switches off transistor VT2 whose collector potential rises towards the positive collector bias potential. The positive increase in collector potential of transistor VT2 applies a reverse bias potential to the gate electrode R and biases the semiconducting p-type current path 5 of the device C to pinched-off or high impedance condition.

By reducing the input at the terminal CT to zero, transistors VT1 and VT3 are switched off and transistor VT2 is switched on. Thus, the semiconducting p-type current paths 5 of the devices A and B are biased to a "pinched-off" or high impedance condition whilst that of the device C is unbiased and in a low impedance condition. The switch is then open.

The structure is comparatively simple to drive between ON and OFF conditions since the switching input is to a reverse biased p-n junction under both conditions and relatively little power is required from the driving source.

The terminals Y and Z are connected to the input and output points, respectively, of a guard rail amplifier so that the potential at Z is always the same as, or a fixed small deviation from, that at the output of the switch.

FIGURES 5–7 show an embodiment of the invention having an alternative form of construction in that the block 1 is divided into two electrically separate regions X and Y by a p-type region 9 extending along the entire length and through the entire thickness of the block 1. This structure may be formed by masking the block 1 except for a central strip on the face 2 and exposing the block to an atmosphere from which a suitable p-type impurity diffuses into the block over the unmasked region. This diffusion is continued for a time sufficient to permit of a deep penetration of the block, as indicated in FIGURE 6. After a sufficient depth of diffusion has occurred, the block 1 is back-lapped to remove the portion of the block indicated by broken lines in FIGURE 6 and expose the p-type diffused region 9.

The other difference in construction, from that of the embodiment shown in FIGURES 1–3, is that instead of a single ohmic contact 8 for the region 1, three such contacts 10 are provided, two in the region X and one in the region Y, each laterally adjacent one of the ohmic connections to the regions 4. The respective contact pairs 6 and 10 are commoned and provide gate electrodes each of the devices A, B and C.

The embodiment shown in FIGURES 5–7 otherwise is similar to that shown in FIGURES 1–3 and may be utilized in a similar manner.

The field-effect switching structures described may usefully be employed in multi-channel telemetry switching applications in which a number of such structures, 24 in one application, are connected together in parallel. Switching structures in accordance with the invention, as is described above, may be manufactured to have a sufficiently low impedance when in the ON, or closed, state and to provide a good cross-talk rejection level between individual structures. In addition, when no signal current flows between the switch terminals X and Y, i.e. in pure voltage sensing to an infinite impedance measuring device, there is no potential difference between the terminals X and Y.

It will be appreciated that several or more structures as described with reference to FIGURES 1–3 or FIGURES 5–7 could be fabricated in a single basic block, by solid state or integrated circuit techniques, to form a multi-element switching array able to perform complex switching functions.

The structure described utilizes a p-type semiconducting current path and n-type gates but a structure having an n-type semiconducting current path and p-type gates also could be used. The gates may be single structures, as described, or double structures.

With reference to FIGURE 8, there is shown in plan view a semiconductor wafer 20 having a switch formed therein according to this invention. FIGURES 9 and 10 are elevational views in section of the wafer of FIGURE 8 taken along the lines 9—9 and 10—10 respectively. The wafer 20 has three field-effect transistors formed therein by diffusion, with these transistors being arranged as in FIGURE 1 to provide a switch as shown schematically in FIGURE 4. The wafer is originally p-type, and has an n-type region 21 diffused in the top surface to form the back gates of the transistors A and B. A separate n-type region 22 is diffused into the p-type substrate to provide the back gate of the transistor C. It is noted that the regions 21 and 22 are electrically isolated from one another through the wafer by the p-n junctions existing between the regions. An elongated p-type region 23 is formed in the n-type region 21 by diffusion to provide the source, drain and channel for each of the transistors A and B. Likewise, a p-type region 24 formed within the region 22 provides the source, drain and channel for the transistor C. The top gates for the transistors A, B and C are provided by three separate elongated diffused n-type regions 25, 26 and 27. It should be noted that these diffused regions 25–27 overlap the edges of the diffused channel regions 23 and 24, and so the top gate of each transistor is ohmically connected within the wafer to its back gate. An oxide coating 28 is formed on the top surface of the wafer 20 for use as a diffusion mask, for junction passivation, and to insulate the deposition metal interconnections from the wafer. The oxide coating 28 is seen to be in a stepped configuration due to the several oxide removal and reformation steps used in the diffusion operation where the oxide functions as a diffusion mask. The drain of the transistor A is engaged by a metal contact 29 which extends over the oxide coating 28 to engage the source of the transistor B at a contact point 30 so these two transistors are ohmically connected together from the drain of one to the source of the other. This same T-shaped metal strip extends over the oxide to the source of the transistor C which it engages at a contact point 31. Separate metallized contacts 32, 33 and 34 ohmically engage the remaining source of drain regions of the transistors A, B and C, respectively. A metal strip 35 extends over the oxide coating 28 to engage the gate regions 25 and 26 through holes in the oxide at points 36 and 37. A bonding pad 38 connected to the strip 35 provides a common gate electrode for the two transistors A and B. A separate metal strip 39 provides a gate contact to the transistor C. The strip 39 engages the gate region 27 at a point 40.

In operation of the device of FIGURES 8–10, the contacts 32 and 33 function as the switch input and output terminals, respectively, with the contact 34 being the common gate terminal. The switch is opened by applying a relatively large positive voltage to the contact 38, thus pinching off the channels of the transistors A and B, while applying a low or negative voltage to the contact 39 to render the channel of the transistor C highly conductive. To close the switch these voltages are reversed, rendering the channels of the transistors A and B highly conductive and the channel of the transistor C a high impedance.

Of course, other field-effect transistor structures could be used in this invention. For example. induced channel or insulated gate field-effect devices could be used rather than junction type devices as described above. Insulated gate devices lend themselves readily to fabrication in integrated circuit form.

What is claimed is:

1. A semiconductor switch comprising input, output and common terminals and first and second control terminals, first, second and third field-effect transistors each having a source, a drain and a gate, the source of the first transistor directly connected to the input terminal, the drain of the second transistor directly connected to the output terminal, the drain of the third transistor directly connected to the common terminal, the drain of the first transistor directly connected to the sources of the second and third transistors, the gates of the first and second transistors directly connected together and to the first control terminal, the gate of the third transistor directly connected to the second control terminal.

2. A switch according to claim 1 wherein means are provided for driving the first and second control terminals with opposing electrical potentials.

3. A switch according to claim 1 wherein the field-effect transistors are all formed within a single body of semiconductor material.

4. A switch according to claim 3 wherein the gates of the first and second field-effect transistors are electrically isolated in the body from the gate of the third field-effect transistor.

References Cited by the Examiner

UNITED STATES PATENTS

| | | | |
|---|---|---|---|
| 3,070,762 | 12/1962 | Evans | 330—70 |
| 3,130,377 | 4/1964 | Brown | 331—108 |
| 3,175,100 | 3/1965 | La Mothe | 307—88.5 |

JOHN W. HUCKERT, *Primary Examiner.*

M. EDLOW, *Assistant Examiner.*